United States Patent
Tran et al.

(10) Patent No.: US 6,891,746 B2
(45) Date of Patent: May 10, 2005

(54) MAGNETO-RESISTIVE DEVICE HAVING SOFT REFERENCE LAYER

(75) Inventors: Lung T. Tran, Saratoga, CA (US); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 277 days.

(21) Appl. No.: 10/351,013

(22) Filed: Jan. 25, 2003

(65) Prior Publication Data

US 2003/0137868 A1 Jul. 24, 2003

Related U.S. Application Data

(62) Division of application No. 09/963,171, filed on Sep. 25, 2001, now Pat. No. 6,576,969.

(51) Int. Cl.[7] ............................................. G11C 11/14
(52) U.S. Cl. .................. 365/158; 365/145; 365/171; 365/173
(58) Field of Search .................. 365/145, 158, 365/171, 173, 213, 232

(56) References Cited

U.S. PATENT DOCUMENTS

| 6,005,798 A | | 12/1999 | Sakakima et al. | |
|---|---|---|---|---|
| 6,005,800 A | * | 12/1999 | Koch et al. | 365/173 |
| 6,538,920 B2 | * | 3/2003 | Sharma et al. | 365/171 |
| 2002/0131219 A1 | * | 9/2002 | Mack et al. | 360/324.12 |

FOREIGN PATENT DOCUMENTS

| EP | 0 809 846 | 12/1997 |
|---|---|---|
| EP | 0 857 901 | 11/1998 |
| JP | 2000208831 | 11/2000 |

* cited by examiner

*Primary Examiner*—David Nelms
*Assistant Examiner*—Long Tran (57) ABSTRACT

A magneto-resistive device includes first and second ferromagnetic layers having different coercivities, and a spacer layer between the first and second layers. Each ferromagnetic layer has a magnetization that can be oriented in either of two directions.

10 Claims, 12 Drawing Sheets

MAGNETO-RESISTIVE DEVICE HAVING SOFT REFERENCE LAYER

This application is a divisional of application Ser. No. 09/963,171, now U.S. Pat. No. 6,576,969, filed on Sep. 25, 2001.

BACKGROUND

The present invention relates to magneto-resistive devices. The present invention also relates to data storage.

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

A typical MRAM device includes an array of memory cells, word lines extending along rows of the memory cells, and bit lines extending along columns of the memory cells. Each memory cell is located at a cross point of a word line and a bit line.

The memory cells may be based on tunneling magneto-resistive (TMR) devices such as spin dependent tunneling (SDT) junctions. A typical SDT junction includes a pinned layer, a sense layer and an insulating tunnel barrier sandwiched between the pinned and sense layers. The pinned layer has a magnetization orientation that is fixed so as not to rotate in the presence of an applied magnetic field in a range of interest. The sense layer has a magnetization that can be oriented in either of two directions: the same direction as the pinned layer magnetization or the opposite direction of the pinned layer magnetization. If the magnetizations of the pinned and sense layers are in the same direction, the orientation of the SDT junction is said to be "parallel." If the magnetizations of the pinned and sense layers are in opposite directions, the orientation of the-SDT junction is said to be "anti-parallel." These two stable orientations, parallel and anti-parallel, may correspond to logic values of '0' and '1.'

The magnetization orientation of the pinned layer may be fixed by an underlying antiferromagnetic (AF) pinning layer. The AF pinning layer provides a large exchange field, which holds the magnetization of the pinned layer in one direction. Underlying the AF layer are usually first and second seed layers. The first seed layer allows the second seed layer to be grown with a (111) crystal structure orientation. The second seed layer establishes a (111) crystal structure orientation for the AF pinning layer.

SUMMARY

A memory device according to the present invention includes first and second ferromagnetic layers having different coercivities, and a spacer layer between the first and second ferromagnetic layers. Each ferromagnetic layer has a magnetization that can be oriented in either of two directions.

According to another aspect of the present invention, a magneto-resistive device includes data and reference layers having different coercivities, and a spacer layer between the first and second layers. Both the data layer and the reference layer have a magnetization that can be oriented in either of two directions.

Other aspects and advantages of the present invention will become apparent from the following detailed description, taken in conjunction with the accompanying drawings, illustrating by way of example the principles of the present invention.

DETAILED DESCRIPTION

Figure 1:
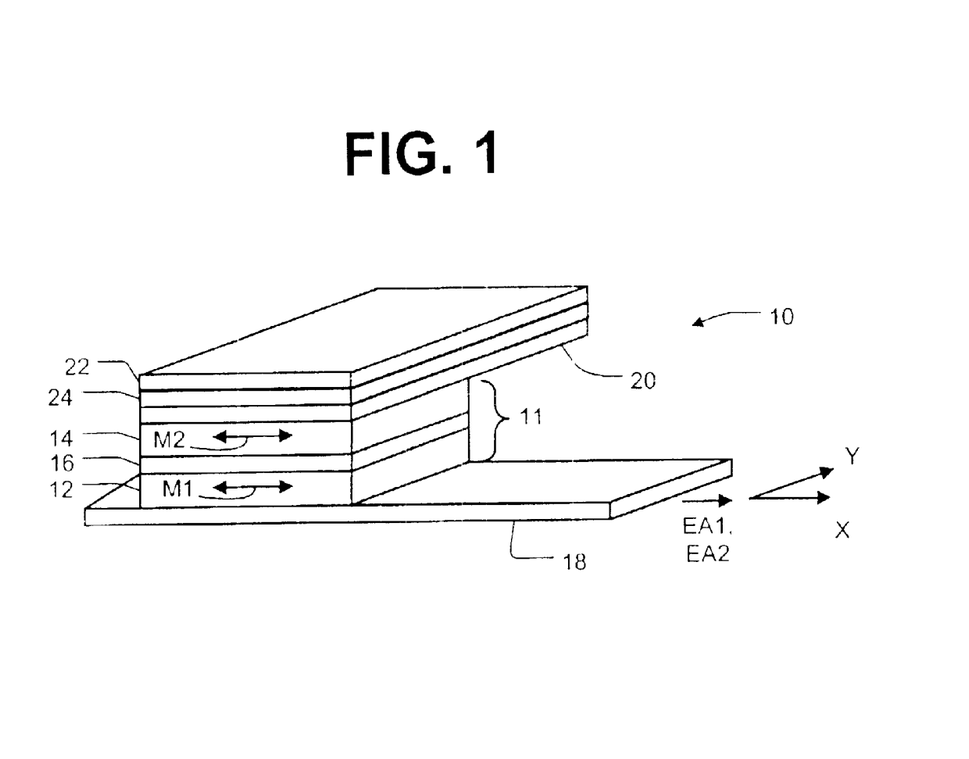
FIG. 1 is an illustration of a magnetic memory device according to the present invention.

Referring to FIG. 1, a magnetic memory device 10 includes a magnetic tunnel junction 11 having a data layer 12, a reference layer 14, and an insulating tunnel barrier 16 between the data and reference layers 12 and 14. Both layers 12 and 14 are made of a ferromagnetic material. The data layer 12 has a magnetization (represented by the vector M1) that can be oriented in either of two directions, typically along the easy axis (EA1) of the data layer 12. The reference layer 14 has a magnetization (represented by the vector M2) that can be oriented in either of two directions, typically along its easy axis (EA2). The easy: axes (EA1, EA2) are shown as extending along the x-axis.

If the magnetizations vectors (M1 and M2) of the data and reference layers 12 and 14 are pointing in the same direction, the orientation of the magnetic tunnel junction 11 is said to be "parallel." If the magnetization vectors (M1 and M2) of the data and reference layers 12 and 14 are pointing in opposite directions, the orientation of the magnetic tunnel junction 11 is said to be "anti-parallel." These two stable orientations, parallel and anti-parallel, may correspond to logic values of '0' and '1.'

The insulating tunnel barrier 16 allows quantum mechanical tunneling to occur between the data and reference layers 12 and 14. This tunneling phenomenon is electron spin dependent, causing the resistance of the magnetic tunnel junction 11 to be a function of the relative orientations of the magnetization vectors (M1 and M2) of the data and reference layers 12 and 14. For instance, resistance of the magnetic tunnel junction 11 is a first value (R) if the magnetization orientation of the magnetic tunnel junction 11 is parallel and a second value (R+ΔR) if the magnetization orientation is anti-parallel. The insulating tunnel barrier 16 may be made of aluminum oxide ($Al_2O_3$), silicon dioxide ($SiO_2$), tantalum oxide ($Ta_2O_5$), silicon nitride ($SiN_4$), aluminum nitride (AlNx), or magnesium oxide (MgO). Other dielectrics and certain semiconductor materials may be used for the insulating tunnel barrier 16. Thickness of the insulating tunnel barrier 16 may range from about 0.5 nanometers to about three nanometers.

Figure 2:
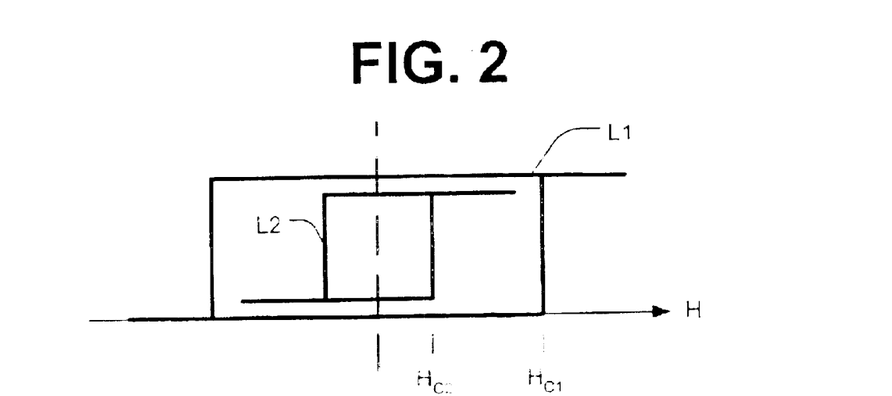
FIG. 2 is an illustration of hysteresis loops for data and reference layers of the magnetic memory device shown in FIG. 1.

Coercivity ($H_{C1}$) of the data layer 12 is much higher than coercivity ($H_{C2}$) of the reference layer 14 (see FIG. 2, which shows hysteresis loops L1 and L2 for the data and reference layers 12 and 14, respectively). The coercivity ($H_{C1}$) of the data layer 12 may be at least 2–5 times greater than the coercivity of the reference layer 14. For example, the coercivity ($H_{C1}$) of the data layer 12 may be about 25 Oe, and the coercivity ($H_{C2}$) of the reference layer 14 may be about 5 Oe. It is preferred to make the coercivity ($H_{C2}$) of the reference layer 14 as low as possible (e.g., by making the reference layer 14 as thin as possible). Thus, the reference layer 14 is considered "softer" than the data layer 12 because its magnetization vector (M2) is much easier to flip.

Coercivities of the two layers 12 and 14 may be made different by using different bit shapes, geometries, compositions, thickness, etc. for the two layers 12 and 14. Potential ferromagnetic layer materials include nickel iron (NiFe), nickel iron cobalt (NiFeCo), cobalt iron (CoFe), other magnetically soft alloys of NiFe and Co, doped amorphous ferromagnetic alloys, and PERMALLOY™. For example, the data layer 12 may be made of a material such as NiFeCo or CoFe, and the reference layer 14 may be made of a material such as NiFe.

A first conductor 18 extending along the x-axis is in contact with the data layer 12. A second conductor 20 extending along the y-axis is in contact with the reference layer 14. The first and second conductors 18 and 20 are shown as being orthogonal. Above the second conductor 20 is a third conductor 22, which also extends along the y-axis. An electrical insulator 24 (e.g., a layer of dielectric material) separates the second and third conductors 20 and 22. The conductors 18, 20 and 22 are made of an electrically conductive material such as aluminum, copper, gold or silver.

Data may be written to the magnetic tunnel junction 11 by supplying write currents to the first and second conductors 18 and 20. The current supplied to the first conductor 18 creates a magnetic field about the first conductor 18, and the current supplied to the second conductor 20 creates a magnetic field about the second conductor 20. The two magnetic fields, when combined, exceed the coercivity ($H_{C1}$) of the data layer 12 and, therefore, cause the magnetization vector (M1) of the data layer 12 to be set in a desired orientation (the orientation will depend upon the directions of the currents supplied to the first and second conductors 18 and 20). The magnetization will be set to either the orientation that corresponds to a logic '1' or the orientation that corresponds to a logic '0'. Because the coercivity ($H_{C2}$) of the reference layer 14 is less than that of the data layer 12, the combined magnetic fields cause magnetization (M2) of the reference layer 14 to assume that same orientation as the magnetization (M1) as the data layer 12.

After write currents are removed from the conductors 18 and 20, the magnetization vector (M1) of the data layer 12 retains its orientation. The magnetization vector (M2) of the reference layer 14 may or may not retain its orientation. If the reference layer 14 is "ultra-soft," it will lose its magnetization orientation when the write currents are removed from the first and second conductors 18 and 20.

The third conductor 22 may be used to assist with write operations. By supplying a current to the third conductor 22 during write operations, the resulting magnetic field about the third conductor 22 combines with the other two magnetic fields to help set the magnetization vector (M1) of the data layer 12 in the desired orientation.

Figure 3:
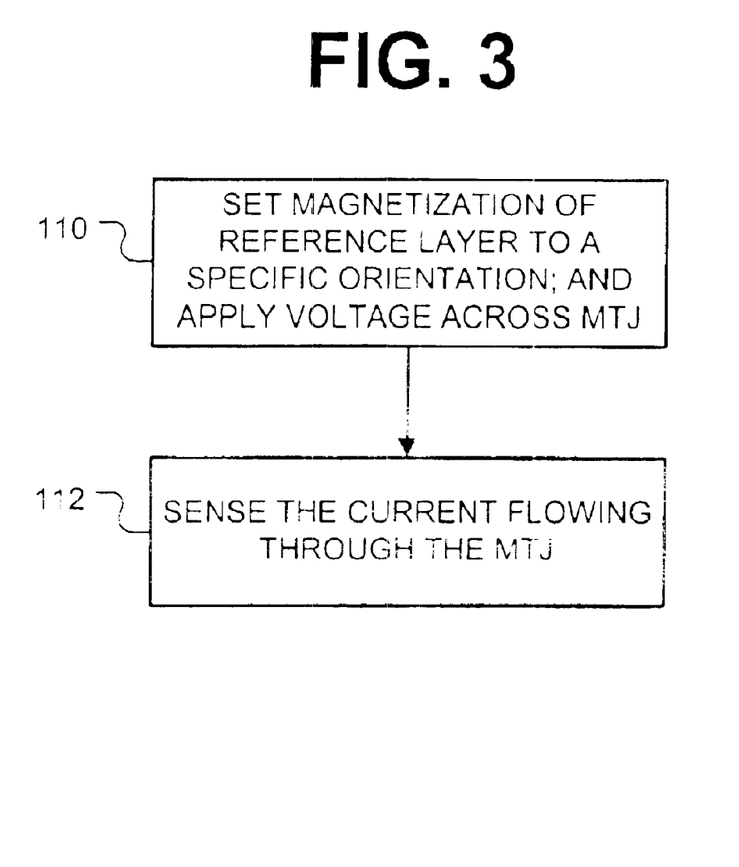
FIG. 3 is an illustration of a first method of performing a read operation on the magnetic memory device shown in FIG. 1.

FIG. 3 illustrates a first method of reading the magnetic memory device 10. A current is supplied to the third conductor 22, and the resulting magnetic field causes the magnetization vector (M2) of the reference layer 14 to assume a specific orientation (block 110). The resulting magnetic field does not affect the magnetization vector (M1) of the data layer 12. Since the coercivity ($Hc_2$) of the reference layer 14 is low, the magnitude of the third conductor current may be low.

As the current is supplied to the third conductor 22, a voltage is applied across the magnetic tunnel junction 11 (block 110). The first and second conductors 18 and 20 may be used to apply the voltage across the magnetic tunnel junction 11. The voltage causes a sense current to flow through the magnetic tunnel junction 11.

Figure 4A:
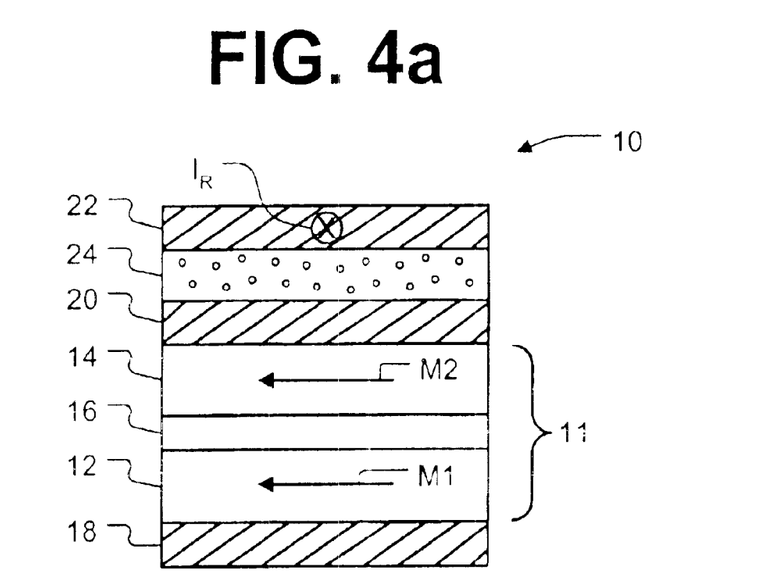
FIGS. 4a and 4b are illustrations of device magnetization orientations corresponding to the first method.
Figure 4B:
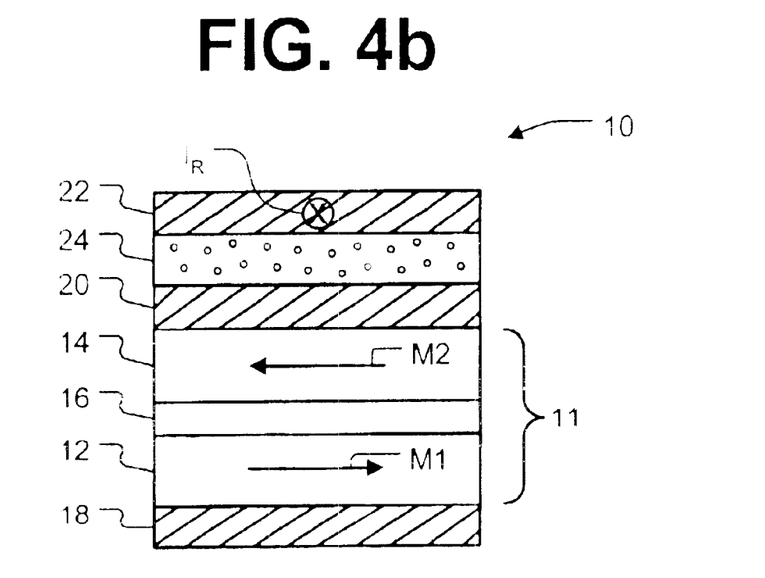

The resistance of the magnetic tunnel junction 11 is measured by sensing the current flowing though the magnetic tunnel junction 11 (block 112). The sensed current is inversely proportional to the resistance of-the magnetic tunnel junction 11. Thus $I_s$=V/R or $I_s$=V/(R+ΔR), where V is the applied voltage, $I_s$ is the sensed current, R is the nominal resistance of the device 10, and ΔR is the change in resistance caused by going from a parallel magnetization orientation to an anti-parallel magnetization orientation Reference is now made to FIGS. 4a and 4b. Consider a magnetic tunnel junction 11 having a nominal resistance (R) of 1 Mohm, and a tunneling magneto-resistance of 30%. A read current ($I_R$) is depicted as flowing into the third conductor 22. The read current ($I_R$) causes the magnetization vector (M2) of the reference layer 14 to point to the left. If the measured resistance R=1 Mohm, the data layer 12 stores a first logic value (FIG. 4a). If the measured resistance R=1.3 Mohm, the data layer stores a second logic value (FIG. 4b). Thus, by setting the magnetization of the reference layer 14 to a known orientation and measuring the resistance of the device 10 (either R or R+ΔR), the logic value stored in the magnetic memory device 10 is determined.

Figure 5:
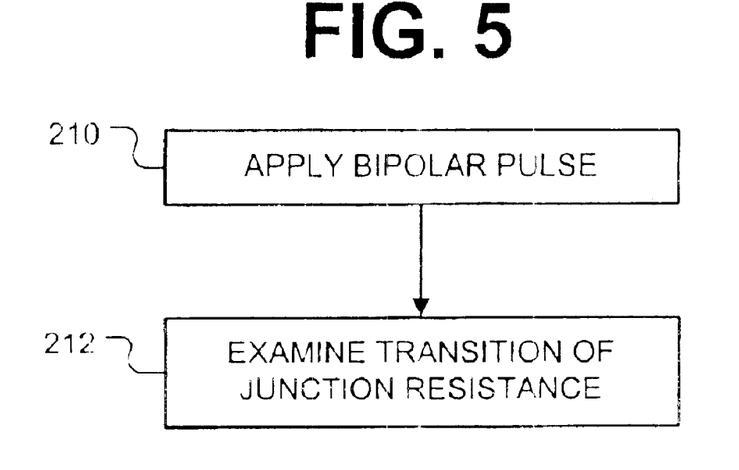
FIG. 5 is an illustration of a second method of performing a read operation on the magnetic memory device shown in FIG. 1.

FIG. 5 illustrates a second method of reading the magnetic memory device 10. A bipolar pulse is applied to the third conductor 22 (block 210), and transition of junction resistance is examined (212). The direction of the transition (that is, going from high to low, or low to high) indicates the magnetization orientation of the data layer 12 and, therefore, the logic value stored in the magnetic memory device 10.

Figure 6A:
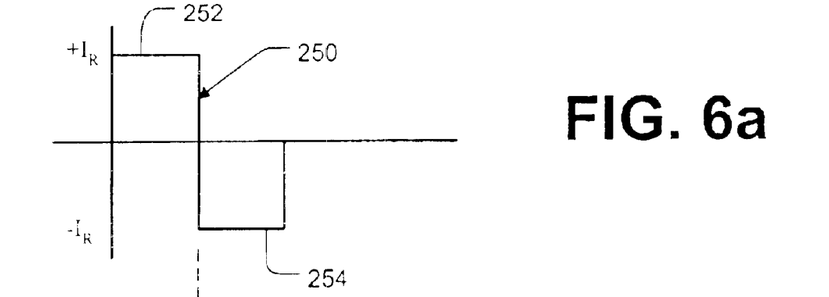
FIGS. 6a–6e and 7a–7e further illustrate the second method.
Figure 6B:
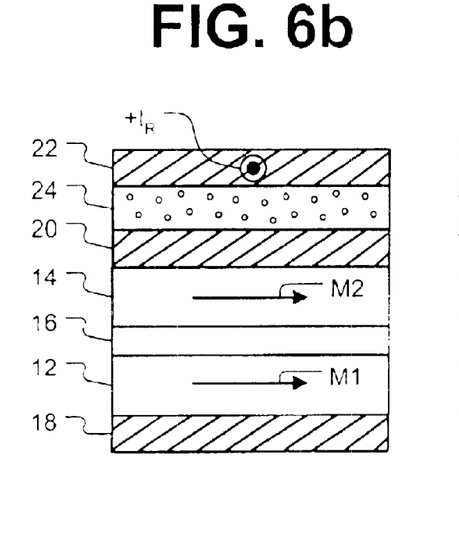
Figure 6C:
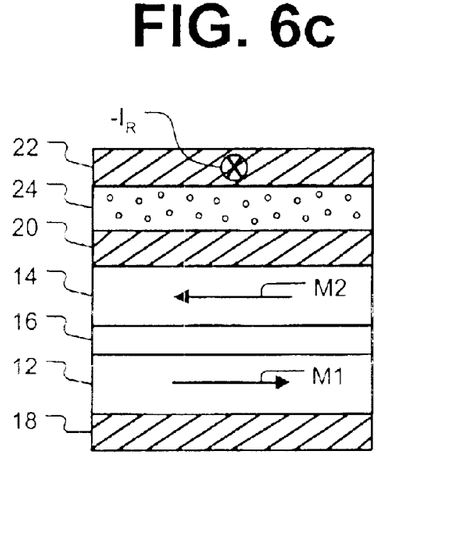
Figure 6D:
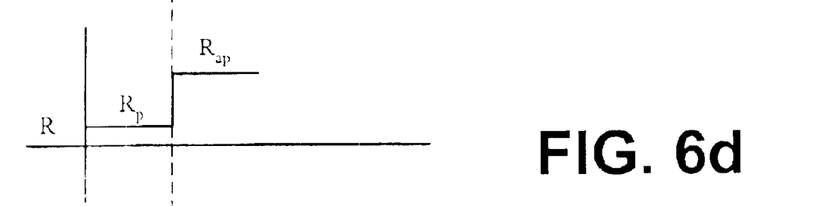
Figure 6E:
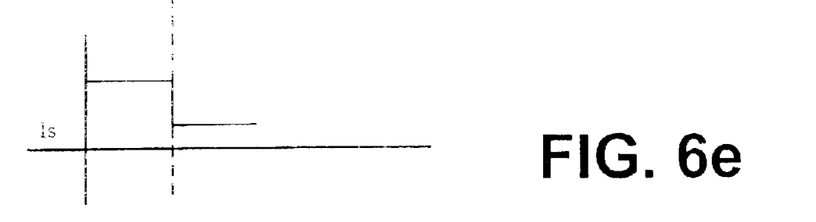

FIGS. 6a–6e further illustrate the second method in connection with a data layer 12 that stores a logic '0.' A bipolar pulse 250 is applied to the third conductor 22 (FIG. 6a). The bipolar pulse 250 has a positive polarity 252 (corresponding to a logic '0') followed by a negative polarity 254 (corresponding to a logic '1'). The positive polarity 252 orients the magnetization of the reference layer 14 in the same direction as that of the data layer 12 (FIG. 6b), whereby the magnetization orientation of the device 10 is parallel and its resistance value is $R_p$. Then the negative polarity 254 orients the magnetization vector (M2) of the reference layer 14 in the opposite direction (FIG. 6c), whereby the magnetization orientation of the device 10 is anti-parallel and its resistance value is R+ΔR or $R_{ap}$. Thus the resistance of the device 10 transitions from low to high (FIG. 6d). The low-to-high transition indicates that a logic '0' is stored in the memory device 10. The corresponding sense current ($I_S$) is shown in FIG. 6e.

Figure 7A:
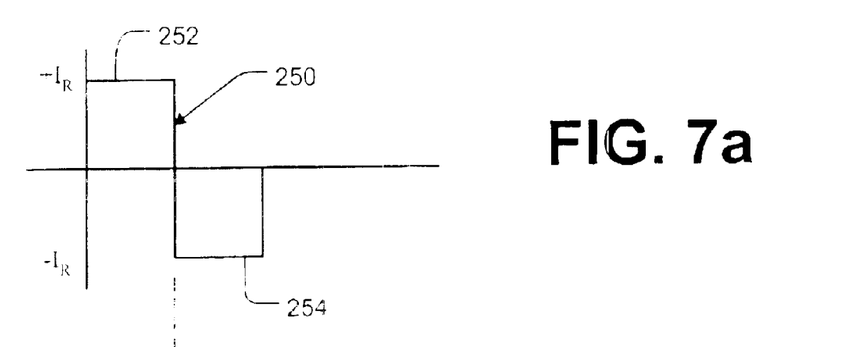
Figure 7B:
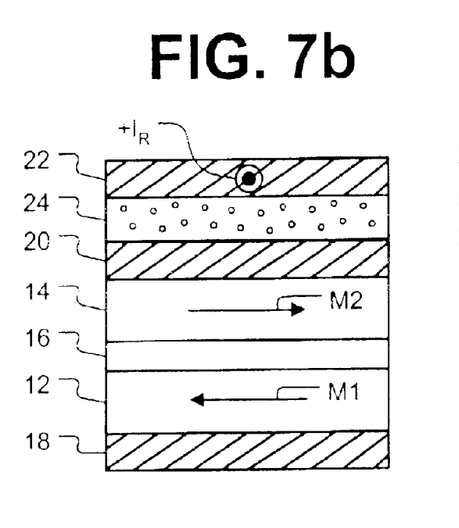
Figure 7C:
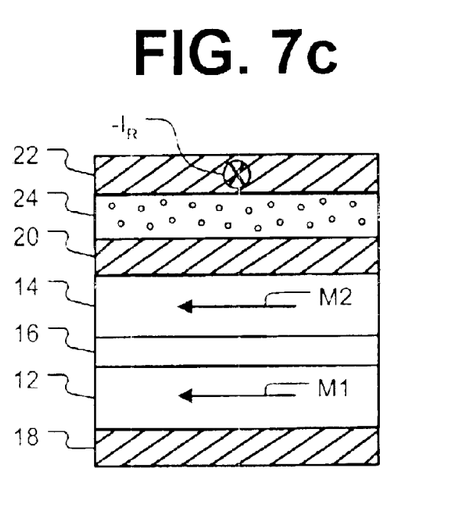
Figure 7D:
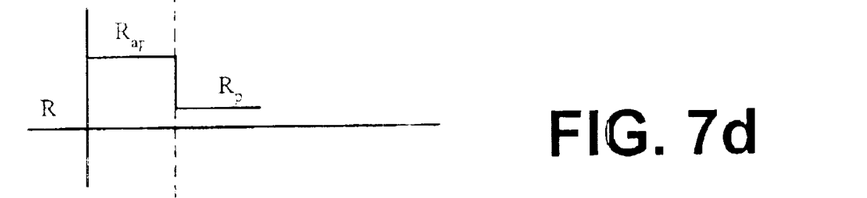
Figure 7E:
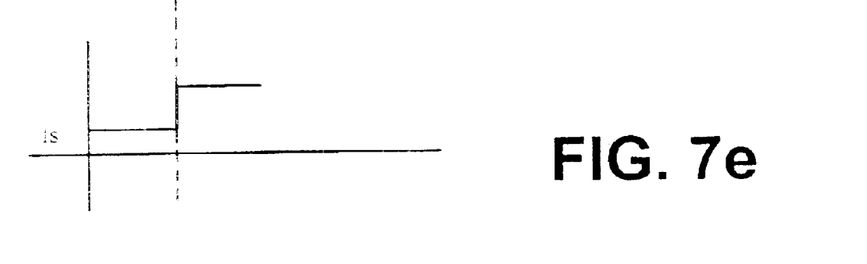

FIGS. 7a–7e illustrate the second method in connection with a data layer 12 that stores a logic '1.' The same bipolar pulse 250 is applied to the third conductor 22 (FIG. 7a). The magnetic memory device transitions from an anti-parallel magnetization orientation (FIG. 7b) to a parallel magnetization orientation (FIG. 7c), whereby the resistance of the magnetic memory device 10 transitions from high to low (FIG. 7d). Thus the high-to-low transition indicates that a logic '1' is stored in the magnetic memory device 10. The corresponding sense current ($I_S$) is shown in FIG. 7e.

The bipolar read operation references to itself. Therefore, this dynamic approach is insensitive to resistance variations across different devices.

The bipolar pulse is not limited to a single positive polarity followed by a single negative polarity, nor is it limited to a positive polarity that corresponds to a logic '0' and a negative polarity that corresponds to a logic '1'. For example, a positive polarity could just as easily correspond to a logic '1', a bipolar pulse could begin with a negative polarity and transition to a positive polarity, etc.

Figure 8:
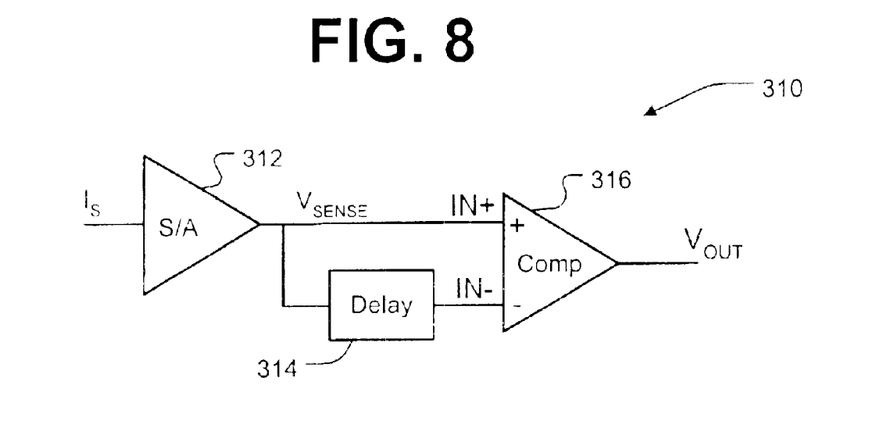
FIG. 8 is an illustration of a circuit for implementing the second method.

A simple sense amplifier 310 for detecting the resistance transition is shown in FIG. 8. The sense current ($I_S$) flowing through the magnetic tunnel junction 11 is supplied to a sense amplifier 312. First and second outputs of the sense amplifier 312 provide a voltage ($V_{SENSE}$) that is proportional to sense current magnitude. The first output is supplied to a first input (IN+) of a comparator 316. The second output of the sense amplifier 312 is supplied to a delay element 314, which has a delay of several nanoseconds. An output of the delay element 314 is supplied to a second input (IN−) of the comparator 316. The comparator 316 compares the sense voltage ($V_{SENSE}$) at the first comparator input (IN+) to the delayed sense voltage at the second comparator input (IN−). An output (VOUT) of the comparator 316 indicates the logic state stored in the magnetic memory device 10.

Figure 9A:
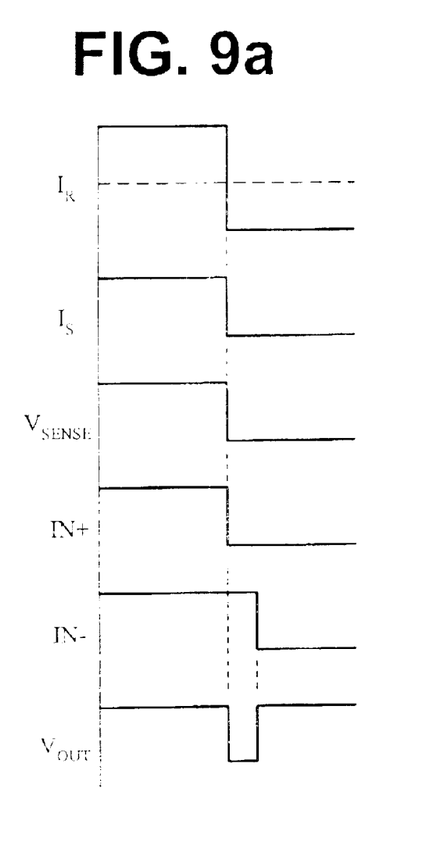
FIGS. 9a and 9b are timing diagrams for the circuit shown in FIG. 8.
Figure 9B:
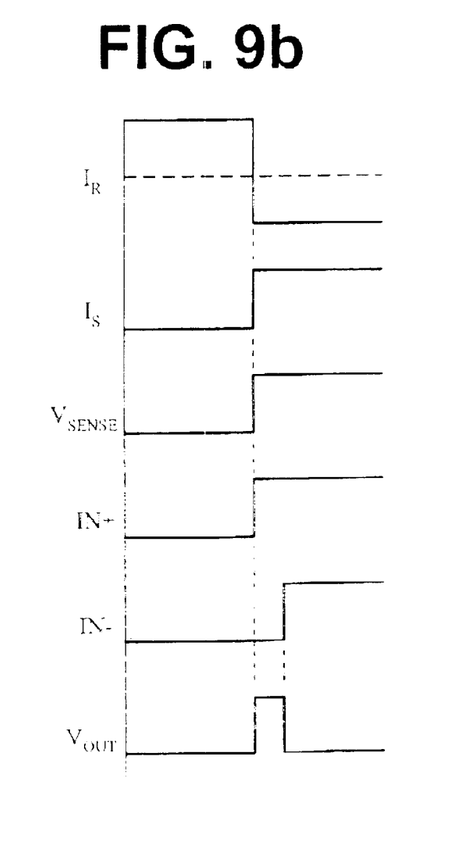

FIGS. 9a and 9b are timing diagrams for the circuit of FIG. 8. FIG. 9a corresponds to FIGS. 6a–6e, and FIG. 9b corresponds to FIGS. 7a–7e.

The magnetic memory device 10 has a simpler structure than a conventional SDT junction. The magnetic memory device 10 is simpler to fabricate than an SDT junction because seed layers and an AF pinning layer are not needed. Annealing of the data layer to set the easy axis may still be performed, but it is done at lower temperatures and is less critical. In addition, the complexity of the deposition process is significantly reduced. Another advantage is that the data layer 12 is on top of a metal conductor, resulting in a more uniform data film and, therefore, better magnetic response and manufacturability (in terms of greater uniformity over a wafer).

Figure 10:
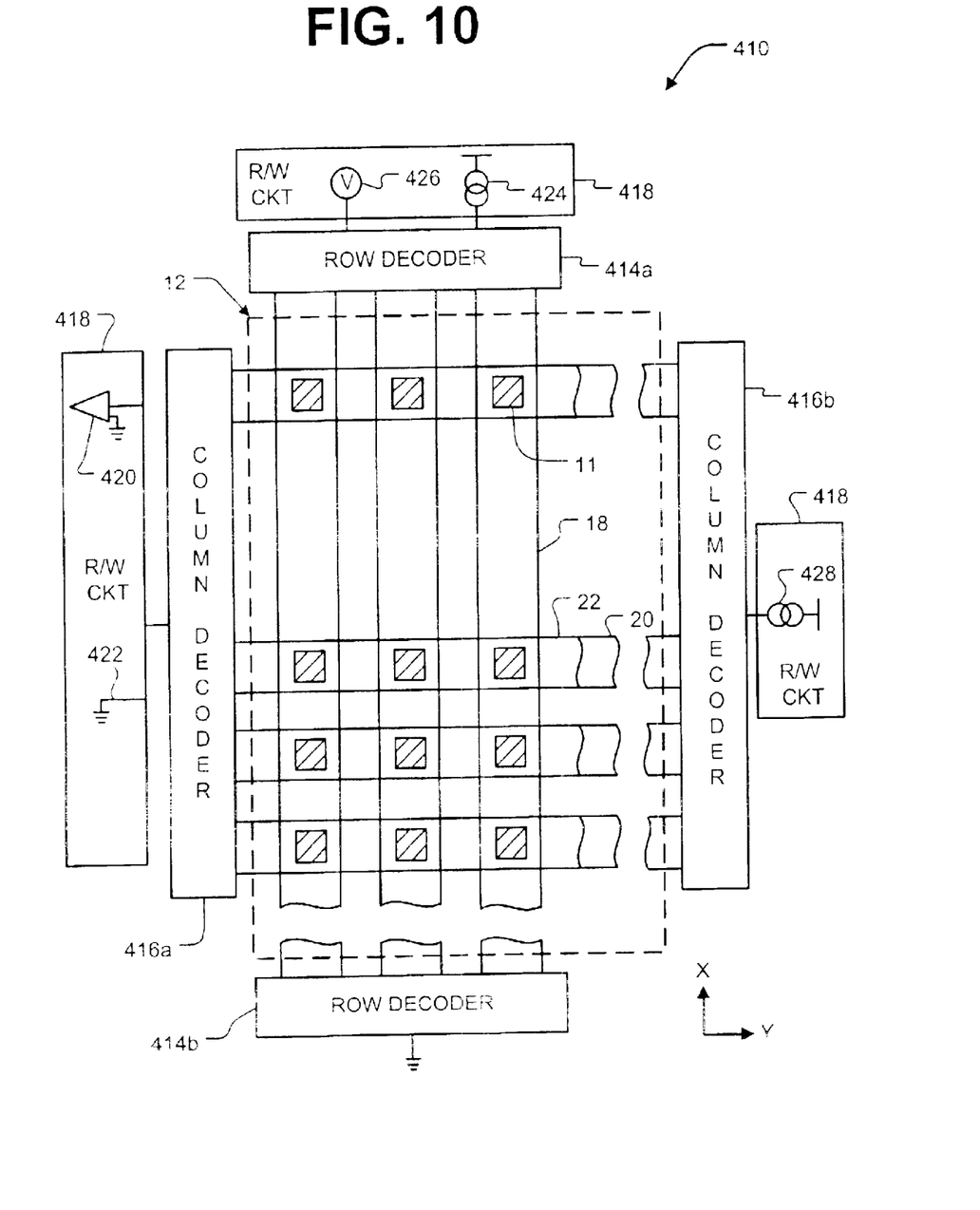
FIG. 10 is an illustration of an MRAM device according to the present invention.

Reference is now made to FIG. 10, which illustrates an MRAM device 410 including an array 12 of magnetic tunnel junctions 11. The magnetic tunnel junctions 11 are arranged in rows and columns, with the rows extending along an x-direction and the columns extending along a y-direction. Only a relatively small number of the magnetic tunnel junctions 11 is shown to simplify the illustration of the MRAM device 410. In practice, arrays of any size may be used.

Traces functioning as word lines 18 extend along the x-direction in a plane on one side of the array 12. The word lines 18 are in contact with the data layers 12 of the magnetic tunnel junctions 11. Traces functioning as bit lines 20 extend along the y-direction in a plane on an adjacent side of the array 12. The bit lines 20 are in contact with the reference layers 14 of the magnetic tunnel junctions 11. There may be one word line 18 for each row of the array 12 and one bit line 20 for each column of the array 12. Each magnetic memory tunnel junction 11 is located at a cross point of a word line 18 and a bit line 20.

Traces functioning as read lines 22 also extend along the y-direction. The read lines 22 are on top of, and insulated from, the bit lines 20. (In the alternative, the read lines 22 may be beneath the bit lines 20, on top of or beneath the word lines 18, along rows or columns, etc.) The read lines 22 are independent of the word and bit lines 18 and 20.

The MRAM device 410 also includes first and second row decoders 414a and 414b, first and second column decoders 416a and 416b, and a read/write circuit 418. The read/write circuit 418 includes a sense amplifier 420, ground connections 422, a row current source 424, a voltage source 426, and a column current source 428.

During a write operation on a selected magnetic tunnel junction 11, the first row decoder 414a connects one end of a selected word line 18 to the row current source 424, the second row decoder 414b connects an opposite end of the selected word line 18 to ground, the first column decoder 416a connects one end of a selected bit line 20 to ground, and the second column decoder 416b connects the opposite end of the selected bit line 20 to the column current source 428. As a result, write currents flow through the selected Word and bit lines 18 and 20. The write currents create magnetic fields, which cause the magnetic tunnel junction 11 to switch. The column decoders 416a and 416b may also cause a write current to flow through the read line 22 crossing the selected magnetic tunnel junction 11. This third write current creates an additional magnetic field that assists in switching the selected magnetic tunnel junction 11.

During a read operation on a selected magnetic tunnel junction 11, the first row decoder 414a connects the voltage source 426 to a selected word line 18, and the first column decoder 416a connects a selected bit line 20 to a virtual ground input of the sense amplifier 420. As a result, a sense current flows through the selected magnetic tunnel junction 11 to the input of the sense amplifier 420. In the meantime, the first and second column decoders 416a and 416b cause either a steady read current or a bipolar current pulse to flow through the read line 22 crossing the selected magnetic tunnel junction 11. If a steady read current is supplied to the selected read line 22, the resistance state of the selected magnetic tunnel junction 11 is sensed by the sense amplifier 420. If a bipolar pulse is supplied to the selected read line 22, the transition of the junction resistance is examined by the sense amplifier 420 (a sense amplifier 420 for examining the transition of the junction resistance may have the same configuration as the sense amplifier 312 shown in FIG. 8).

The magnetic tunnel junctions 11 are coupled together through many parallel paths. The resistance seen at one cross point equals the resistance of the magnetic tunnel junction 11 at that cross point in parallel with resistances of magnetic tunnel junctions 11 in the other rows and columns. Thus the array 12 of magnetic tunnel junctions 11 may be characterized as a cross point resistor network.

Because the magnetic tunnel junctions 11 are connected as a cross point resistor network, parasitic or sneak path currents can interfere with the read operations on selected magnetic tunnel junctions 11. Blocking devices such as diodes or transistors may be connected to the magnetic tunnel junctions 11. These blocking devices can block the parasitic currents.

In the alternative, the parasitic currents may be dealt with by using an "equipotential" method disclosed in assignee's U.S. Pat. No. 6,259,644. If configured to use the equipotential method, the read/write circuit 418 may provide the same potential to the unselected bit lines 20 as the selected bit line 20, or it may provide the same potential to the unselected word lines 18 as the selected bit line 20.

Because the read lines 22 are electrically insulated from the bit lines 20, they do not add to the resistive cross coupling of the magnetic tunnel junctions 11. Therefore, an equal potential is not applied to the read lines 22.

FIG. 10 shows an MRAM device 410 with three different types of traces: word lines 18, bit lines 20, and read lines 22. However, the present invention is not so limited. For example, an MRAM device according to the present invention may have only two different types of traces: word lines 18 and bit lines 20.

Figure 11:
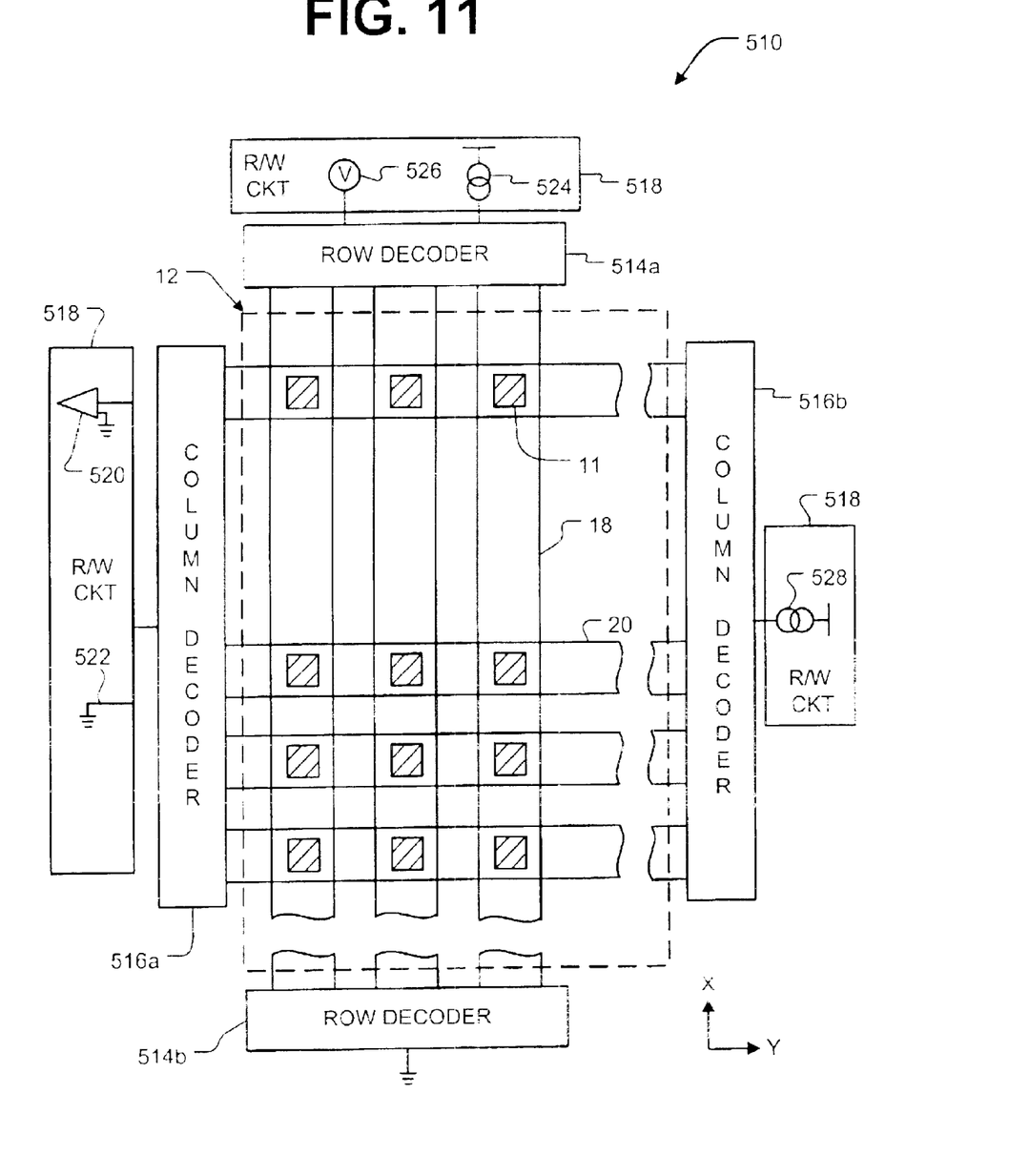
FIG. 11 is an illustration of an alternative MRAM device according to the present invention.

Reference is made to FIG. 11, which illustrates an MRAM device 510 including word lines 18 and bit lines 20, but not read lines 22. Magnetic tunnel junctions 11 are located at cross points of word and bit lines 18 and 20.

Figure 12:
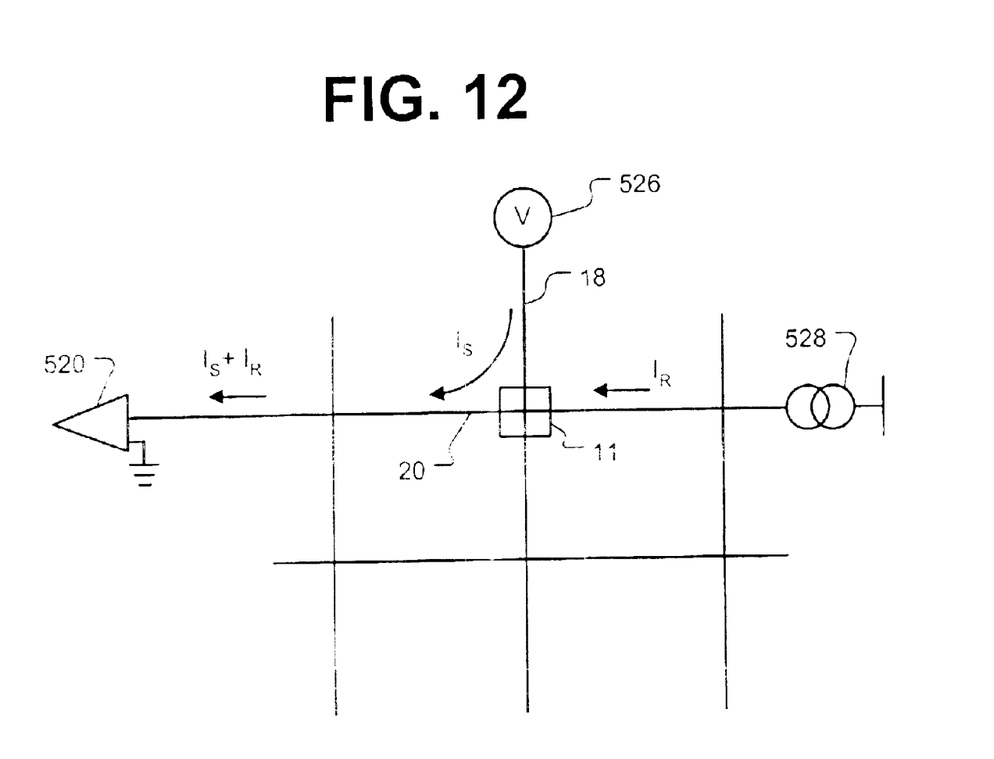
FIG. 12 is an illustration of the alternative MRAM device during a read operation.

Additional reference is made to FIG. 12, which illustrates a read operation using only the word and bit lines 18 and 20. The first row decoder 514a connects the voltage source 526 to a selected word line 18, and the first column decoder 516a connects one end of a selected bit line 20 to a virtual ground input of the sense amplifier 520. As a result, a sense current ($I_S$) flows through the selected magnetic tunnel junction 11 to the sense amplifier 520. The second column decoder 516b connects the column current source 528 to the other end of the selected bit line 20. As a result, a read current ($I_R$) flows through the selected bit line 20 to the sense amplifier 520. The read current ($I_R$) sets the magnetization vector of the reference layer. The sense amplifier 520 senses the sum of sense and read currents ($I_S+I_R$). Since the magnitude of the read current ($I_R$) is known, the magnitude of the sense current ($I_S$), and hence the resistance and logic states of the magnetic tunnel junction 11, can be determined.

The magnetic tunnel junctions 11 described thus far include individual reference layers 14, with each reference layer 14 having the same geometry as its corresponding data layer 12 and tunnel barrier 16. However, the present invention is not limited to reference layers having the same geometry as the data layers and tunnel barriers.

Instead, the reference layers may have the same geometry as the word and bit lines 18 and 20. Such reference layers will be referred to as "reference lines."

Figure 13A:
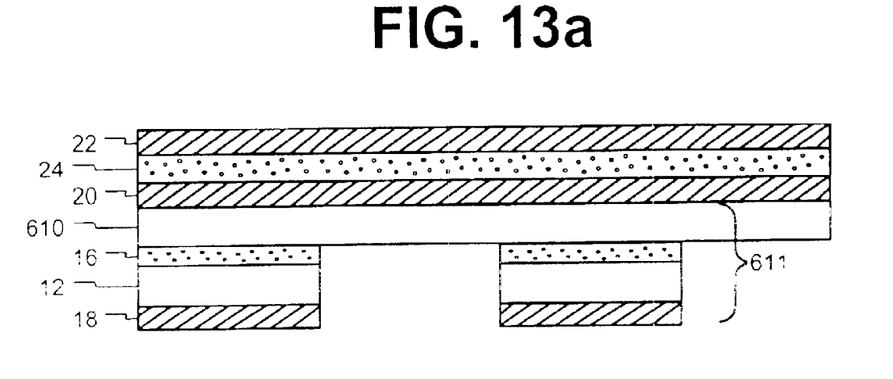
FIGS. 13a, 13b, and 14–17 are illustrations of different clad conductors for an MRAM device according to the present invention.

Reference is now made to FIG. 13a, which shows a reference line 610 that is shared by multiple magnetic tunnel junctions 611. Layered on top of the reference line 610 are bit and read lines 20 and 22. The reference line 610 extends in the same direction as the bit and read lines 20 and 22. Thus each magnetic tunnel junction 611 of a column includes an individual data layer 12, an individual tunnel barrier 16, and the shared reference line 610.

Figure 13B:
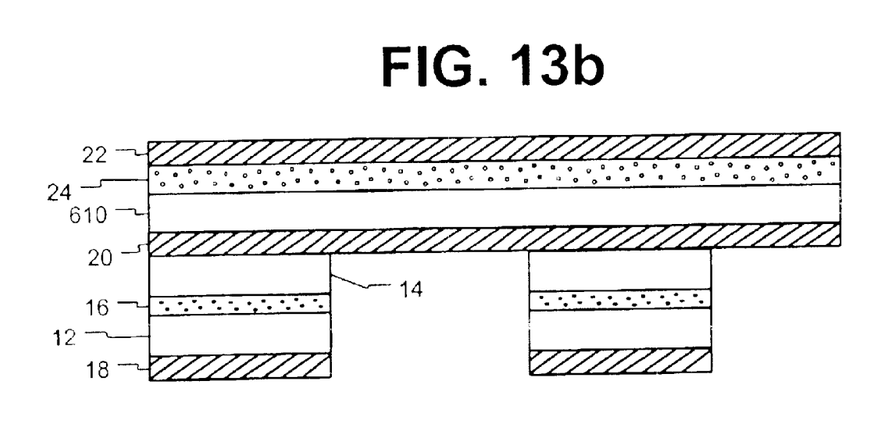

The present invention is not limited to reference lines 610 that are layered beneath bit lines 20 as shown in FIG. 13a. Instead, the reference lines 610 may be layered on top of bit lines 20 (see FIG. 13b); or the reference lines 610 may be layered on or beneath read lines 22 (and would extend in the same direction as the read lines 22), or the reference lines 610 may be layered on or beneath word lines 18 (and would extend in the same direction as the word lines 18). If the reference line 610 is layered on top of the bit line 20 and, therefore, is not in contact with the tunnel barrier 16, than a patterned layer 14 is formed between the tunnel barrier 16 and the word, bit line 20, as shown in FIG. 13b.

The present invention is not limited to reference lines that are layered with respect to word, bit or read lines 18, 20 or 22. The reference lines may be combined with the word, bit and/or read lines as shown in FIGS. 14-17. The reference lines may be combined with any of the other lines by cladding reference line ferromagnetic material onto any of the other lines. One benefit of combining the reference lines with other lines is eliminating an extra interconnect layer. An added benefit of the cladding is that it can reduce power consumption, since the cladding allows read and write current magnitudes to be reduced.

Figure 14:
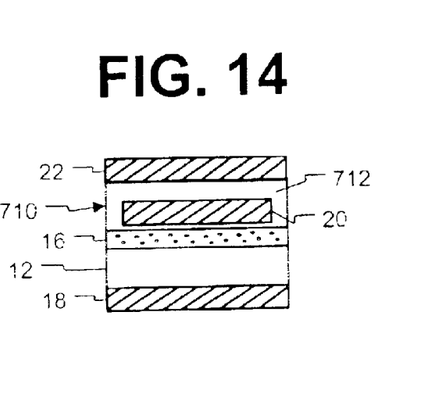

FIG. 14 shows a bit line 20 that is clad with a ferromagnetic material (e.g., NiFe). The cladding 712 forms a soft or ultra-soft reference line 710. The bit line 20 is located between the read line 22 and the insulating tunnel barrier 16. A dielectric layer (not shown) may separate the read line 22 from the reference line 710.

The ferromagnetic cladding 712 may completely enclose the bit line 20 to provide flux path closure. That portion of the cladding 712 between the tunnel barrier 16 and the bit line 20 may be thinner.

During write operations, a write current is applied to the bit line 20 and the resulting magnetic field causes the reference line 710 to saturate. The thinner portion of the reference line 710 directs the magnetic field to the data layer 12.

During read operations, a read current flows through the read line 22 to set the magnetization orientation of the reference line 710, while sense and parasitic currents flow through the word and bit lines. The ferromagnetic cladding 712 should not saturate in the presence of magnetic field created by sense and parasitic currents flowing through the word lines during read operations. As long as it does not, any magnetic fields arising from sense and parasitic currents will not interfere with the data layer 12.

Figure 15:
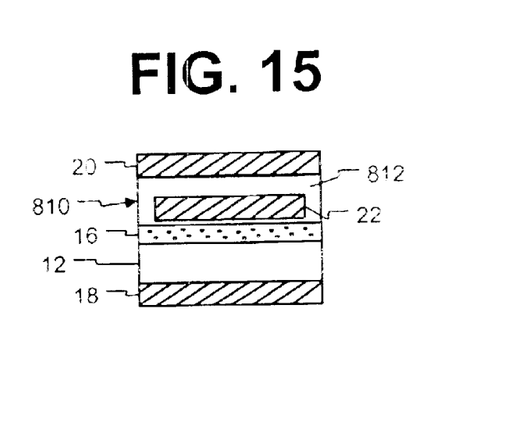
Figure 16:
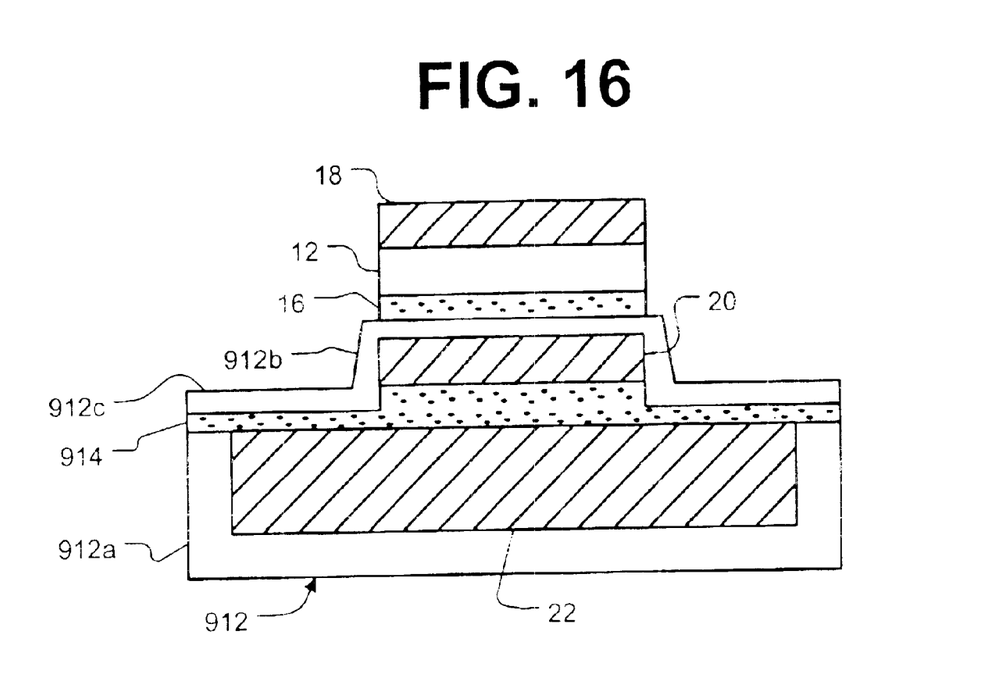

FIG. 15 shows a read line 22 that is clad with a ferromagnetic material (e.g., NiFe). The cladding forms a soft or ultra-soft reference line 810. The read line 22 is located between the word line 20 and the insulating tunnel barriers 16. The ferromagnetic cladding may completely enclose the read line 22 to provide flux path closure (as shown in FIG. 16), or it may partially surround the read line 22 (not shown). The unclad portion of such a read line 22 is in direct contact with the tunnel barriers 16, and the remaining portions are clad with ferromagnetic material.

The ferromagnetic cladding 812 should not saturate in the presence of a read magnetic field (that is, the magnetic field that occurs when a read current is supplied to the read line 22 and that is used to orient the magnetization vector of the reference line 810). As long as the cladding 812 fully contains the read magnetic field, the read magnetic field will not extend beyond the cladding 812, where it could interfere with the data layer 12.

As compared to the configuration of FIG. 14, the word line 20 is moved further away from the data layer 12, which reduces the strength of the magnetic field applied by the word line 20 during write operations. To compensate for the reduced magnetic field, a write current is also supplied to the clad read line 810 during write operations. The magnetic field provided by the read line 22 during write operations assists with switching.

FIG. 16 shows a reference line 912 including ferromagnetic material that is clad onto both a bit line 20 and a read line 22. The reference line 912 includes three portions: a lower portion 912a, an upper portion 912b, and a cap portion 912c. The lower portion 912a is separated from the other two portions 912b and 912c by a dielectric 914. Although electrically insulated from the other portions 912b and 912c, the lower portion 912a is magnetically coupled to the other portions 912b and 912c.

The lower portion 912a of the reference line 912 includes the read line 22. Cladding covers the bottom and sides of the read line 22. The upper surface of the read line 22 is not covered with ferromagnetic cladding, but is covered with the dielectric 914.

The upper portion 912b of the reference line 912 includes the bit line 20. Cladding covers the top and sides of the bit line 20. The bottom surface of the bit line 20 is not covered with cladding, but is covered with the dielectric 914. The bit and read lines 20 and 22 are also separated by the dielectric 914.

The read line 22 is provided with a larger cross-section than the bit line 20 to compensate for manufacturing tolerances. During manufacture, the upper portion of the reference line 912b should be centered over the lower portion 912a. In practice, however, misalignments can occur. Even if misalignments occur, the upper portion will still be positioned over the lower portion 912a so as not to cause a short between the bit and read lines 20 and 22.

The cap portion 912c extends outward from the upper portion 912b and over the sidewalls of the lower portion 912a. The cap portion 912c also covers the dielectric 914. The cap portion 912c closes the magnetic flux path between the lower and upper portions 912a and 912b. A gap between the cap portion 912c and sidewalls of the lower portion 912a may be filled with the dielectric 914. The gap prevents a short between the bit line 20 and the read line 22. The magnetic field produced by the bit line 20 extends across the gap and into the cap portion 912c.

A plurality of insulating tunnel barriers 16 are formed on the upper portion 912b of the reference line 912, and corresponding data layers 12 are formed on the insulating tunnel barriers 16. Word lines 18 are formed on the data layers 12.

The depiction of the cladding thickness in the lower portion 912a is exaggerated. The thickness may be about 1 nm to 50 nm (with a typical value of 5 nm) for the lower, upper, and cap portions 912a, 912b and 912c. A read magnetic field produced only by the read line 22 does not saturate the upper portion 912b of the reference line 912. A write magnetic field produced only by the bit line 20 can saturate the lower portion 912a of the reference line 912.

The electrical insulation (i.e., the dielectric 914) between the bit and read lines 20 and 22 allows separate currents to be supplied to the bit word lines 20 and read lines 22. The separate currents, in turn, allow for independent field control during read and write operations. By adjusting the currents supplied to the bit and read lines 20 and 22, the resulting two magnetic fields can be adjusted to orient the magnetization of the lower portion 912a only, or the magnetization of the upper portion 912b only, or the magnetization of both the upper and lower portions 912a and 912b of the reference line 912.

Figure 17:
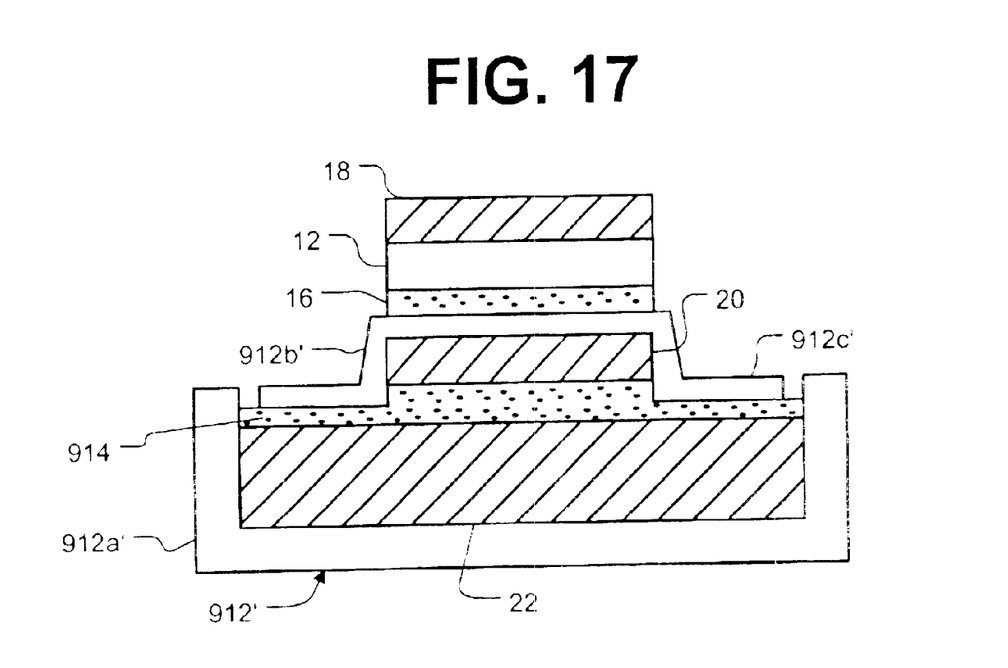

FIG. 17 shows a reference line 912' in which the sidewalls of the lower portion 912a' extend upward above the dielectric layer 914'. There is an air gap or insulator between the sides of the cap portion 912c' and sidewalls of the lower portion 912a'.

The present invention is not limited to clad word lines. The word and bit lines may be transposed, and the bit lines may instead be clad with the ferromagnetic material.

Figure 18A:
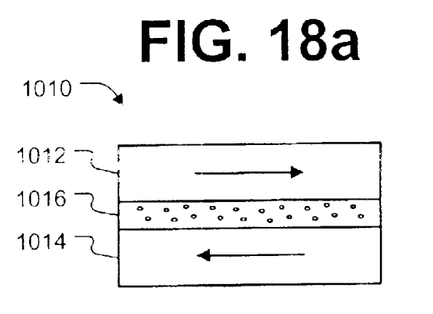
FIGS. 18a and 18b are illustrations of a synthetic ferrimagnet reference layer for a magnetic memory device according to the present invention.
Figure 18B:
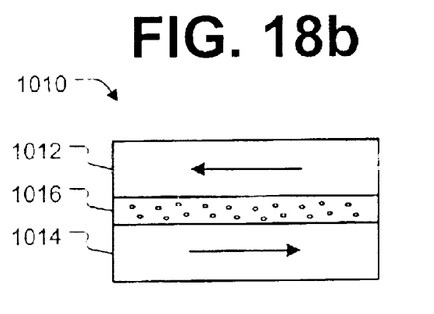

The reference layers and lines are not limited to ferromagnets. For instance, a reference line may be implemented as a synthetic ferrimagnet (SF), also known as an artificial antiferromagnet. Referring to FIGS. 18a and 18b, the SF reference layer 1010 may include first and second ferromagnetic layers 1012 and 1014 separated by a metallic spacer layer 1016. The ferromagnetic layers 1012 and 1014 may be made of a material such as CoFe, NiFe or Co, and the spacer layer 1016 may be made of an electrically conductive, magnetically non-conductive material such as Ru, Re, Rh or Cu. There is a strong interlayer exchange coupling between the two ferromagnetic layers 1012 and 1014. The magnitude of this coupling and also its sign (whether it is positive or negative) is a function of the spacer thickness/material and ferromagnetic layer materials and thicknesses. The coupling is negative, i.e., the magnetization vectors of the two ferromagnetic layers 1012 and 1014 are anti-parallel.

Figure 19:
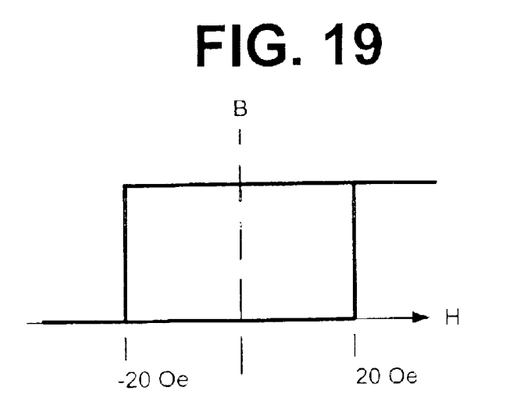
FIG. 19 is an illustration of a hysteresis loop for an individual ferromagnetic layer of the synthetic ferrimagnet reference layer.

The size of the bit, its shape and the thickness of a particular FM layer decide its coercivity, i.e., the x-axis component of the hysteresis loop. One of the hysteresis loops is shown in FIG. 19. The total volume of the FM layer and the unit magnetization (the magnetic moment per unit volume) of the layer material determine the total magnetization or moment of the layer, i.e., the y-axis component of the hysteresis loop.

Figure 20:
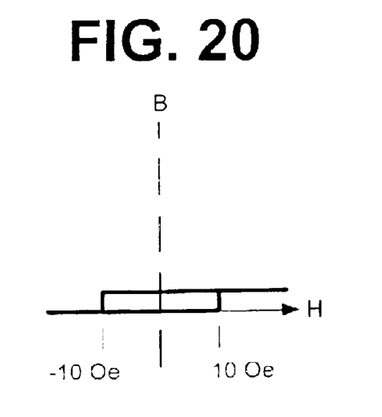
FIG. 20 is an illustration of a hysteresis loop for the synthetic ferrimagnet reference layer.

The coercivities of the two FM layers 1012 and 1014 may be slightly different (e.g., 10±5 Oe, 50±10 Oe). The coercivity of the SF reference layer 1010 is lower than that of the individual FM layers 1012 and 1014. Since the magnetizations of the two FM layers 1012 and 1014 point in opposite directions, their moments tend to cancel each other, i.e., $M_{SF}=M_1-M_2$, where $M_1$ is the magnetic moment of the first ferromagnetic layer 1012, $M_2$ is the magnetic moment of the second ferromagnetic layer 1014, and $M_{SF}$ is the resultant magnetic moment of the SF reference layer 1010. Resulting is the hysteresis loop of FIG. 20.

Thickness of the spacer layer 1016 may be between about 0.2 nm and 2 nm. Each ferromagnetic layer 1012 and 1014 may, for example, have a coercivity of about 10–100 Oe and similar hysteresis loops. If, for example, the thickness of the first layer 1012 is three nanometers and the thickness of the second layer 1014 is four nanometers, the resulting imbalance will result in the hysteresis loop of equivalent to a 1 nm thickness. The resulting coercivity can be controlled to less than 10 Oe by varying the ratio of thickness of the first and second layers 1012 and 1014. This low coercivity allows the magnetization vector of the SF reference layer 1010 to be switched easily between the orientations shown in FIGS. 18a and 18b.

Exchange coupling between the magnetization vectors of the two layers 1012 and 1014 is very strong. Consequently, a very large magnetic field (e.g., 4000 Oe) would be needed to decouple the magnetization vectors of the ferromagnetic layers 1012 and 1014.

Exemplary SF reference layers 1010 are as follows.

|  | Example 1 | Example 2 | Example 3 | Thickness (nm) |
|---|---|---|---|---|
| Layer 1012 | CoFe | NiFe | Co | 3 |
| Spacer 1016 | Ru | Ru | Ru | 0.75 |
| Layer 1014 | CoFe | NiFe | Co | 4 |

The SF reference layer is not limited to the three-layer structure just described. The SF reference layer may include more than three layers. For example, the SF reference layer may include the following five reference layers: FM1/Ru1/FM2/Ru2/FM3, all having different thicknesses.

The SF reference layer may be clad. The cladding can reduce stray fields and reduce read/write current requirements (by concentrating the magnetic fields generated during read and write operations).

Although the present invention was described in connection with a TMR device, it is not so limited. The present invention may be applied to other types of magneto-resistive devices that have similar operational characteristics. For instance, the present invention may be applied to giant magneto-resistive (GMR) devices. A GMR device has the same basic configuration as a TMR device, except that data and reference layers are separated by a conductive non-magnetic metallic layer instead of an insulating tunnel barrier. Exemplary spacer layer metals include gold, silver and copper. The relative orientations of the data and reference magnetization vectors affect in-plane resistance of a GMR device.

The present invention is not limited to GMR and TMR devices. For instance, the present invention may be applied to top and bottom spin valves.

Although several specific embodiments of the present invention have been described and illustrated, the present invention is not limited to the specific forms or arrangements of parts so described and illustrated. Instead, the present invention is construed according to the claims the follow.

What is claimed is:

1. An information storage device comprising an array of memory cells, each memory cell including first and second ferromagnetic layers, the first and second ferromagnetic layers having magnetizations that can be switched between first and second directions during write operations, only the second layer being switchable between first and second directions during read operations.

2. The device of claim 1, further comprising a plurality of first traces extending along the array in a first direction; a plurality of second traces extending along the array in a second direction, the first and second directions being roughly orthogonal; and a plurality of third traces also extending in the second direction, the second and third lines being separated by an electrical insulator.

3. The device of claim 2, further comprising a circuit for applying write currents to the first and second traces during write operations; and supplying read currents to the third traces during read operations.

4. The device of claim 3, wherein the circuit also supplies write currents to the third traces during write operations.

5. The device of claim 3, wherein the circuit supplies steady read currents to the third lines during read operations.

6. The device of claim 5, further comprising a sense amplifier for determining resistance states o(selected memory cells based on magnitudes of sense currents flowing through the memory cells.

7. The device of claim 2, wherein the circuit applies bipolar pulses to the third lines during read operations.

8. The device of claim 2, wherein the circuit further includes a sense amplifier for determining junction resistance transitions during read operations.

9. The device of claim 2, further comprising:
a plurality of first traces extending along the array in a first direction;
a plurality of second traces extending along the array in a second direction;
a circuit for applying a voltage across a selected cell and simultaneously supplying a current to selected memory cells during read operations, whereby first and second currents flow through the selected memory cells during read operations; and
a sense amplifier for determining resistance states of the selected memory cells based on the first and second currents.

10. The device of claim 2, wherein magnetization orientation of the second layer is not affected by currents flowing through the first, second and third conductors during read operations.

* * * * *